(12) United States Patent
Bigl et al.

(10) Patent No.: US 10,420,220 B2
(45) Date of Patent: Sep. 17, 2019

(54) ELECTRONIC ASSEMBLY WITH A COMPONENT ARRANGED BETWEEN TWO CIRCUIT CARRIERS, AND METHOD FOR JOINING SUCH AN ASSEMBLY

(71) Applicant: Siemens Aktiengesellschaft, Munich (DE)

(72) Inventors: Thomas Bigl, Herzogenaurach (DE); Alexander Hensler, Fürth (DE); Stephan Neugebauer, Erlangen (DE); Stefan Pfefferlein, Heroldsberg (DE); Jörg Strogies, Berlin (DE); Klaus Wilke, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/301,064

(22) PCT Filed: May 2, 2017

(86) PCT No.: PCT/EP2017/060361
§ 371 (c)(1),
(2) Date: Nov. 13, 2018

(87) PCT Pub. No.: WO2017/198447
PCT Pub. Date: Nov. 23, 2017

(65) Prior Publication Data
US 2019/0191566 A1 Jun. 20, 2019

(30) Foreign Application Priority Data
May 18, 2016 (EP) .................................. 16170185

(51) Int. Cl.
*H05K 1/18* (2006.01)
*H05K 3/46* (2006.01)
(Continued)

(52) U.S. Cl.
CPC ............ *H05K 1/181* (2013.01); *H05K 1/0298* (2013.01); *H05K 3/321* (2013.01); *H05K 3/46* (2013.01)

(58) Field of Classification Search
CPC ........ H05K 1/181; H05K 1/0298; H05K 3/46; H05K 3/321
(Continued)

(56) References Cited

U.S. PATENT DOCUMENTS

| 4,563,725 A | * | 1/1986 | Kirby | .................. H01L 23/4006 |
| | | | | 174/16.3 |
| 5,904,499 A | | 5/1999 | Pace | ............................ 438/108 |

(Continued)

FOREIGN PATENT DOCUMENTS

| CN | 105529277 A | 4/2016 | ............. H01L 21/58 |
| CN | 105575936 A | 5/2016 | ............. H01L 21/56 |

(Continued)

OTHER PUBLICATIONS

Extended European Search Report, Application No. 16170185.9, 5 pages, dated Jul. 29, 2016.
(Continued)

*Primary Examiner* — Sherman Ng
(74) *Attorney, Agent, or Firm* — Slayden Grubert Beard PLLC

(57) ABSTRACT

Various embodiments may include an electronic assembly comprising: a first circuit carrier having a first mounting face for electronic components; a second circuit carrier having a second mounting face for electronic components; wherein the second mounting face faces the first mounting face and is connected thereto; and an electronic component connected both to the first mounting face and the second mounting face; wherein the first mounting face includes a contact region between the first circuit carrier and the component;
(Continued)

and the contact region is flexible in a direction perpendicular to the first mounting face in comparison to an adjacent region of the first circuit carrier surrounding the contact region and in comparison to the second circuit carrier.

14 Claims, 3 Drawing Sheets

(51) Int. Cl.
*H05K 3/32* (2006.01)
*H05K 1/02* (2006.01)

(58) Field of Classification Search
USPC .................................................. 174/254, 259
See application file for complete search history.

(56) References Cited

U.S. PATENT DOCUMENTS

| | | |
|---|---|---|
| 8,033,014 B2 | 10/2011 | Yu et al. .......................... 29/846 |
| 2011/0127663 A1 | 6/2011 | Swaminathan ............... 257/690 |
| 2013/0214404 A1 | 8/2013 | Orimoto ........................ 257/692 |
| 2015/0262972 A1 | 9/2015 | Katkar et al. .................... 257/48 |
| 2016/0113123 A1 | 4/2016 | Jones et al. ................. 228/123.1 |
| 2016/0132069 A1 | 5/2016 | Hunger et al. ................ 327/534 |
| 2017/0033024 A1 | 2/2017 | Busche et al. ................ 257/698 |
| 2017/0117162 A1 | 4/2017 | Busche et al. ................ 438/121 |

FOREIGN PATENT DOCUMENTS

| | | | |
|---|---|---|---|
| DE | 10 2014 206 601 A1 | 10/2015 | ............. H01L 21/48 |
| DE | 10 2014 206 608 A1 | 10/2015 | ............. H01L 21/48 |
| WO | 2017/198447 A1 | 11/2017 | ............. H01L 23/04 |

OTHER PUBLICATIONS

International Search Report and Written Opinion, Application No. PCT/EP2017/060361, 16 pages, dated Aug. 11, 2017.
Chinese Office Action, Application No. 201780030565.6, 8 pages, dated May 7, 2019.

* cited by examiner

ELECTRONIC ASSEMBLY WITH A COMPONENT ARRANGED BETWEEN TWO CIRCUIT CARRIERS, AND METHOD FOR JOINING SUCH AN ASSEMBLY

CROSS-REFERENCE TO RELATED APPLICATIONS

This application is a U.S. National Stage Application of International Application No. PCT/EP2017/060361 filed May 2, 2017, which designates the United States of America, and claims priority to EP Application No. 16170185.9 filed May 18, 2016, the contents of which are hereby incorporated by reference in their entirety.

TECHNICAL FIELD

The present disclosure relates to assembly of electronics. Various embodiments may include an electronic assembly with a component arranged between to circuit carriers.

BACKGROUND

Various assemblies of electronic components are known by way of example from DE 10 2014 206 601 A1. The component that is described therein comprises a power component with contact surfaces on its upper face and on its lower face. The component is connected in an electrically conductive manner by means of its lower face to a ceramic substrate. A second circuit carrier in the form of a hood provides contact with the upper face of the component, wherein said circuit carrier comprises conductive tracks that make contact with the first circuit carrier, in other words on a different plane. The hood-shaped circuit carrier is therefore suitable for forming a cavity in which the component may be held between the two circuit carriers with the result that different wiring planes are produced. In so doing, on account of it being necessary to make contact on different planes and with different components, the aforementioned arrangement results in a statically overdetermined system with the result that a tolerance compensation is necessary in order to ensure that a reliable contact is made.

DE 10 2014 206 608 A1 describes a tolerance compensation in a similarly configured assembly. The hood-shaped circuit carrier is constructed according to said publication from a plurality of plastically deformable layers, wherein layers are also provided between said layers so as to provide a wiring arrangement and a contact arrangement. This circuit carrier may be placed on the first circuit carrier after the component has been mounted and may be influenced by means of a joining force during the procedure of soldering the contacts. In so doing, the circuit carrier deforms, thereby compensating for tolerances. The heat that is required for the soldering procedure ensures simultaneously that the material of the circuit carrier hardens, wherein a sealed cavity for the component is simultaneously produced.

Furthermore, US 2011/0127663 A1 describes sealing components in a cavity formed by a hood against the external environment. The hood is fastened by means of a sealing medium to the substrate for the component with the result that the cavity is hermetically sealed against the surrounding area. In addition, it is also possible to provide a thermal connection between the component and the hood with the result that said connection may absorb heat that arises in the component.

SUMMARY

As demonstrated, the above illustrated solutions are more complex the more functions are to be integrated into the circuit carrier. Simultaneously, problems arise with regard to providing a reliable contact on account of the static overdeterminancy of the described systems. The teachings of the present disclosure may be embodied in an electronic assembly, in which the component is to be held between two circuit carriers and electrically contacted, to such an extent that on the one hand a reliable contact with the component is possible and on the other hand the components may be produced and mounted in a cost-effective manner.

For example, some embodiments may comprise: a first circuit carrier having a first mounting face for electronic components, a second circuit carrier having a second mounting face for electronic components, wherein the second circuit carrier with the second mounting face faces the first mounting face of the first circuit carrier and is connected thereto, and at least one electronic component that is connected both to the first mounting face and also to the second mounting face.

The electronic assembly provides that the first circuit carrier is configured in a contact region, which is formed between the first circuit carrier and the component, both in comparison to the first circuit carrier that is surrounding the contact region and also in comparison to the second circuit carrier, so as to be flexible in the direction perpendicular with respect to the first mounting face. It is possible by virtue of the flexible design to achieve dimensional tolerances and positional tolerances of the participating joining partners, in other words of the two circuit carriers, the component and deposits of a joining agent, for example a soldering material or a sintering material, are compensated for by virtue of the fact that the contact region flexes as joins are produced in the joining direction and therefore in a perpendicular direction with respect to the first mounting face and preferably also with respect to the second mounting face. In so doing, it is possible to connect the components or the component to the first and/or the second circuit carrier in an electrical and/or thermal manner. When a circuit carrier or two circuit carriers are mentioned below, this is always intended to mean the first circuit carrier and the second circuit carrier or one of these circuit carriers if it is not obvious whether the statement is made relating to the first circuit carrier or the second circuit carrier.

As another example, some embodiments may include an electronic assembly comprising: a first circuit carrier (11) having a first mounting face (12) for electronic components, a second circuit carrier (13) having a second mounting face (14) for electronic components, wherein the second circuit carrier (13) with the second mounting face (14) faces the first mounting face (12) of the first circuit carrier (11) and is connected thereto, at least one electronic component (16) that is connected both to the first mounting face (12) and also to the second mounting face (14) characterized in that the first circuit carrier (13) in a contact region (21) that is formed between the first circuit carrier (13) and the component (16) is configured in comparison to the first circuit carrier (13) that is surrounding the contact region (21) and in comparison to the second circuit carrier (13) so as to be flexible in the direction perpendicular with respect to the first mounting face (12).

In some embodiments, the contact region (21) lies on a fitting piece (30) that is fitted with an interference fit into a cut-out (31) in the first circuit carrier (11), wherein it is possible to push the fitting piece (30) in the cut-out (31) in a perpendicular direction with respect to the first mounting face (12).

In some embodiments, the contact region (21) is configured in comparison to the first circuit carrier (13) that is surrounding the contact region (21) and in comparison to the second circuit carrier (13) in a more elastic manner in the direction perpendicular with respect to the first mounting face (12).

In some embodiments, the contact region (21) comprises a layer (32), the material of said layer being more elastic than the material of the remaining part of the first circuit carrier (11). In some embodiments, the elastic layer (32) is configured from polysiloxane.

In some embodiments, the material of the first circuit carrier (11) is thinner in the contact region (21) in comparison to the circuit carrier that is surrounding the contact region.

In some embodiments, the material of the thinner region is laminated into the first circuit carrier (11) and is exposed in the contact region (21).

In some embodiments, the material of the thinner region is polyimide.

In some embodiments, the edge of the contact region (21) is weakened by means of cut-outs.

In some embodiments, the cut-outs are slits (26) that penetrate the first circuit carrier (11), wherein webs (27) that connect the contact region (21) to the remaining part of the first circuit carrier (11) are provided between the slits (26).

In some embodiments, the webs (27) comprise branches and/or they extend with at least one change of direction in the plane of the first mounting face (12).

In some embodiments, the cut-outs are grooves (28).

In some embodiments, multiple parallel extending grooves (28) are provided, wherein said grooves are incorporated in an alternating manner into the first mounting face (12) and into the opposite face (29) of the first circuit carrier (11), said opposite face facing away from the first mounting face (12).

In some embodiments, the first circuit carrier (11) comprises a depression (20) in the first mounting face (12) and/or the second circuit carrier (13) comprises a depression (20) in the second mounting face (14), the component (16) being positioned in said depression.

In some embodiments, the first circuit carrier (11) and the second circuit carrier (13) form a cavity (15) that is closed with respect to the external environment.

In some embodiments, the component (16) is connected to the first mounting face (12) and/or to the second mounting face (14) in a firmly bonded manner.

In some embodiments, the component (16) is connected to the first mounting face (12) or to the second mounting face (14) in a force-fitting manner.

As another example, some embodiments may include a method for joining an electronic assembly as claimed in any one of the preceding claims, characterized in that the component (16) is fitted to the first circuit carrier (11) or the second circuit carrier (13), afterwards the first circuit carrier (11) is joined to the second circuit carrier (13) and the connections are formed between the component and the first circuit carrier (11) and/or the second circuit carrier (13).

In some embodiments, at least some of the connections are formed between the first circuit carrier (11), the second circuit carrier (13) and the component (16) by means of a sintering procedure and/or by means of a soldering procedure and/or by means of an electrically conductive adhesive.

In some embodiments, as the first circuit carrier (11) is connected to the second circuit carrier (13) a joining force F is applied to the flexible contact region (21).

BRIEF DESCRIPTION OF THE DRAWINGS

Further details of the teachings herein are described below with reference to the drawings. Like or corresponding elements in the drawing are provided in each case with like reference numerals and are only explained more than once insofar as there are differences between the individual figures. In the drawings.

DETAILED DESCRIPTION

Figure 1:
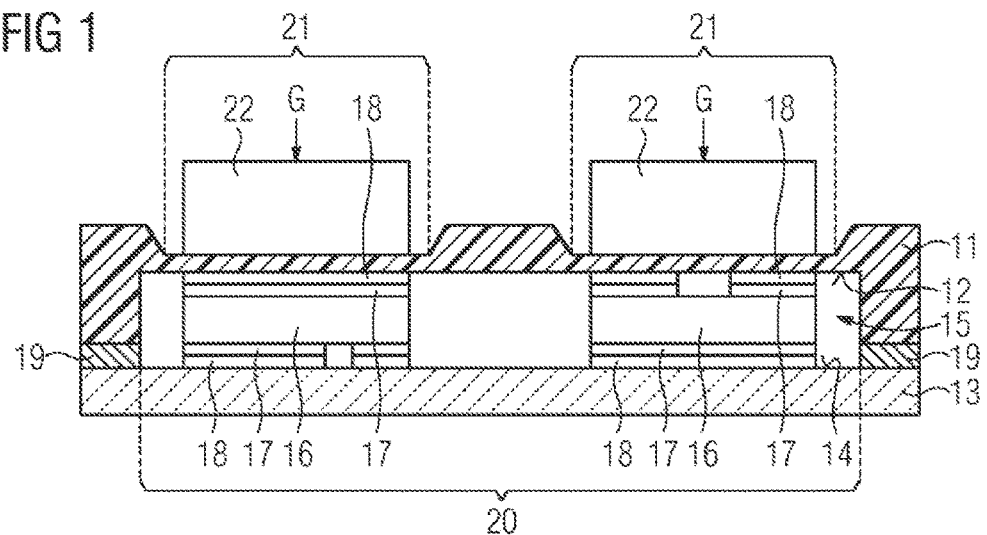
FIG. 1 illustrates a schematic sectional view of an exemplary embodiment of the electronic assembly incorporating teachings of the present disclosure.

Some embodiments of the present disclosure compensate for the tolerances by means of a flexible contact region, in other words the region on the first circuit carrier on which the component is placed possibly with the aid of a joining agent, because the electronic assembly is statically overdetermined on account of the multiplicity of connections that are to be formed. It is therefore necessary for tolerances that may be of different dimensions in the case of the joining partners to be compensated for by means of a flexibility of at least a part of the joining partners. This flexibility may be produced in the simplest manner in the case of the first circuit carrier. The assembly may be joined in a simple manner, wherein the joining sites are configured in a reliable manner.

In some embodiments, the contact region lies on a fitting piece that is fitted with an interference fit, in particular with an overdimension, into a cut-out in the first circuit carrier, wherein it is possible to push the fitting piece in the cut-out in a perpendicular direction with respect to the first mounting face. In the case of this variant, the flexibility of the mounting region is produced by a fit with an overdimension so the fitting piece is fixed in the first circuit carrier, wherein said fitting piece may be moved in a perpendicular direction with respect to the first mounting face in order to compensate for tolerances. In some embodiments, it is ensured by means of a clearance fit or a transition fit that the fitting piece may be displaced very easily. This configuration is relatively simple in construction, wherein the electronic assembly after the joining procedure lies to a great extent in a force-free manner in the cut-out by virtue of the fitting piece shifting with the result that the electrical connections are not subjected to a load.

In some embodiments, the contact region is configured both in comparison to the first circuit carrier that is surrounding the contact region and also in comparison to the second circuit carrier in a more elastic manner in the direction perpendicular with respect to the first mounting face. The term 'elastic' means that the contact region at least in part regions, in particular in its edge region, has a comparatively lower modulus of elasticity than the remaining part of the first circuit carrier and the second circuit carrier, as a result of which the flexibility of the contact region is produced so to say in an intrinsic manner by means of a material characteristic. This may produce a reversible tolerance region that may also be re-used for replacing the component by way of example after a repair using a soldering procedure.

In some embodiments, the elastic contact region is configured from a layer, the material of which is more elastic than the material of the remaining part of the first circuit carrier. By way of example, the elastic layer is configured from polysiloxane. Said elastic layer may be applied in a simple manner as a sheet at least in the contact regions of the first circuit carrier and said elastic layer then forms the substrate for the component and said component may also make contact with said substrate. The circuit carrier may be produced in a simple manner since it is only necessary to perform one additional mounting step to apply the elastic layer.

In some embodiments, the material of the first circuit carrier may be thinner in the contact region in comparison to the circuit carrier that is surrounding the contact region. This statement is intended to mean that the material of the circuit carrier is less thick in this region than in the zones of the circuit carrier that are surrounding the contact region. This produces a greater degree of elasticity in the contact region which may be achieved by means of a production step that is simple to perform, by way of example by means of milling or etching.

In some embodiments, the thinner region may be extended in that the material of the thinner region is laminated into the first circuit carrier and is exposed in the contact region. In some embodiments, laminated circuit boards may be used as a semi-finished product for the said structure, wherein one of these laminated layers is used by means of being exposed as a thinner region. In so doing, it is possible to produce the first circuit carrier using a semi-finished product that is cost-effective to produce because it is technically widely used. The material may comprise polyimide. It is possible to use a production technique known per se for producing so-called flex-rigid circuit boards that comprise part regions that are flexible and comprise part regions that are rigid in comparison thereto. In some embodiments, the flexible part regions are used as the contact region for the component.

In some embodiments, the edge of the contact region is weakened by means of cut-outs. The fact that the edge of the contact region is weakened leads to the contact region as a whole flexing in that the edge that is mechanically weakened by means of the cut-outs is deformed in an elastic manner if the contact region is displaced in the mounting direction in a perpendicular manner with respect to the first mounting face. Cut-outs may be produced by way of example by means of milling or etching for which advantageously simple and reliable production methods are available.

In some embodiments, the cut-outs are slits that penetrate the first circuit carrier, wherein webs are provided between the slits, said webs connecting the contact region to the remaining part of the first circuit carrier. In this manner, the webs form bending beams that may be used as an elastic region. Said bending beams are connected at their ends respectively to the contact region and to the remaining first circuit carrier. Since the slits penetrate the circuit carrier, in other words produce through-going openings in the circuit carrier, it is only possible to introduce a force respectively at the ends of the bending beams.

In some embodiments, the webs may comprise branches and/or they extend with at least one change of direction in the plane of the first mounting face. As a consequence, the bending rigidity of the bending beams that are formed by means of the webs may be influenced and it is possible to adapt the webs to suit the geometry of the contact region.

In some embodiments, the cut-outs are grooves. These grooves do not completely penetrate the circuit carrier but are only incorporated into the first mounting face and/or into an opposite face of the first circuit carrier that is facing away from the first mounting face. Said grooves therefore weaken the cross section of the circuit carrier and produce in this manner an elastic region that may be arranged in particular at the edge of the contact region. In some embodiments, multiple parallel extending grooves are provided, wherein said grooves are incorporated in an alternating manner into the first mounting face and into the opposite lying opposite face. As a consequence, a particularly elastic structure is produced that is similar to that of a folding bellows. In particular in the case of fiber-reinforced circuit boards, in which the grooves break through the reinforcing fibers, the elasticity is considerably increased in comparison to the remaining part of the first circuit carrier.

In some embodiments, the first circuit carrier comprises a depression in the first mounting face and/or the second circuit carrier comprises a depression in the second mounting face, the component being positioned in said depression. As a consequence, the component may be inserted into a cavity that is sealed against the external environment and is formed in the region of the depression by means of the first circuit carrier and the second circuit carrier. This cavity may be filled in addition by means of an electrical insulating material.

In some embodiments, the component is connected in a firmly bonded manner to the first mounting face and/or to the second mounting face. In so doing, it is possible by way of example to use soldered connections or sintered connections or also adhesive connections. The connections may be used to transmit an electrical current or also to transmit heat.

In some embodiments, the component is connected to the first mounting face or to the second mounting face in a force-fitting manner. In so doing, the flexibility in particular the elasticity in the contact region is used in order to exert a force on the force-fitting connection. Such a connection is suitable for transmitting an electrical current and/or thermal energy. This advantageously simplifies the mounting process for the electronic assembly since joining agents are not required at the force-fitting connection.

Some embodiments may include a method for joining an electronic assembly. Said method is characterized in that the component is fitted to the first circuit carrier or to the second circuit carrier. Afterwards, the first circuit carrier is joined to the second circuit carrier. In so doing, connections are formed between the component and the first circuit carrier and/or the second circuit carrier. In so doing, an electronic assembly, such as already described above, is produced, wherein the described advantages are achieved.

In some embodiments, at least some of the connections between the first circuit carrier, the second circuit carrier and the component are formed by means of a sintering procedure and/or by means of a soldering procedure. As a consequence, it is possible to produce very reliable connections with which it is possible to transmit electrical currents and/or thermal energy.

In some embodiments, as the first circuit carrier is connected to the second circuit carrier a joining force F is applied to the flexible contact region. It is possible by means of the joining force to move the contact region within the scope of its flexibility in the joining direction in a perpendicular manner with respect to the first mounting face, in order for example to overcome gaps that occur as a result of dimensional tolerances of the joining partners. It is also possible in this manner to increase the magnitude of joining force that is exerted on the electrical connections that are being formed, which is of advantage by way of example when producing a sintered connection.

In accordance with FIG. 1, a first circuit carrier 11 is illustrated that comprises a first mounting face 12 configured from a conductor board material, by way of example epoxide-based systems such as FR4, and a second circuit carrier 13 is illustrated that comprises a second mounting face 14 configured from a ceramic, by way of example $Al_2O_3$, $Si_3N_4$, or AlN. These two circuit carriers 11, 13 form a cavity 15 into which two components 16 are inserted. The components 16 are connected respectively to the first mounting face 12 and the second mounting face 14 via soldered connections 17. For this purpose, the two mounting faces 12, 14 provide contact pads 18 so as to provide electrical contact. In addition, the first circuit carrier 11 is connected in an electrically conductive manner to the second circuit carrier 13 via an adhesive connection 19, as a result of which the cavity 15 is sealed with respect to the external environment.

The cavity 15 is formed by means of a depression 20 in the first circuit carrier 11. The components 16 are accommodated within this depression. In addition, contact regions 21 are provided for the components 16, said contact regions carrying the contact pads 18 on the mounting face 12. The contact regions 21 are in addition configured by means of greater elasticity in such a manner as to be more flexible than the remaining part of the circuit carrier 11, which is achieved in accordance with FIG. 1 by means of thinning the material of the circuit board. This results in depressions which define the contact region 21 and are provided on the face of the circuit carrier 11 that lies opposite the mounting face. FIG. 1 illustrates that it is possible during a mounting procedure to place on the contact regions 21 by way of example weights 22 that exert a weight force G on the first circuit carrier 11 so as to support a joining procedure.

Figure 2:
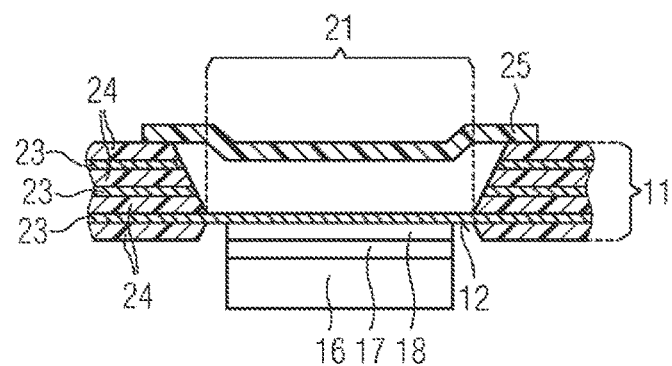
FIGS. 2 to 6 illustrate further exemplary embodiments of the assembly in accordance with the invention, wherein in each case only the contact region is illustrated in the cross sectional view or as a plan view and wherein these contact regions may be provided in a construction of the assembly in accordance with FIG. 1 and FIGS. 7 and 8 illustrate respectively exemplary embodiments of the method incorporating teachings of the present disclosure in a state of production and in the schematic cross sectional view.

It is apparent in FIG. 2 that the first circuit carrier 11 is configured as a laminate having multiple layers 23 that are laminated into the material 24 of the circuit carrier. One of the layers 23 forms the thinner contact region 21 on which the contact pad 18 together with the component 16 is arranged. In addition, the thinner contact region may be provided with a cover 25 in order to protect said region against the external environment.

Figure 3:
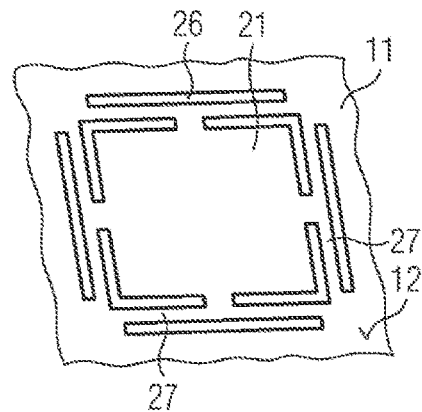

In accordance with FIG. 3, the contact region 21 is separated from the remaining part of the circuit carrier 11 by means of slits 26 in the mounting face 12. Webs 27 are formed between the slits and act as bending beams with the result that hereby an extremely elastic region is produced. The webs connect moreover the mounting region 21 to the remaining part of the circuit carrier 11. The mounting region 21 is available to receive a component (not illustrated). The slits 26 are configured as through-going openings in the circuit carrier 11, with the result that in a manner not illustrated a cover 25 may be provided in a similar manner to that shown in FIG. 2 if the cavity that is formed by the two circuit carriers 11, 13 is to be sealed against the external environment.

It is also possible to incorporate a structure in accordance with FIG. 3 into a thinner mounting region 21 in accordance with FIG. 1 or FIG. 2 in order to additionally increase the elasticity. This also applies for the structure in accordance with FIG. 4 that is to be explained below.

Figure 4:
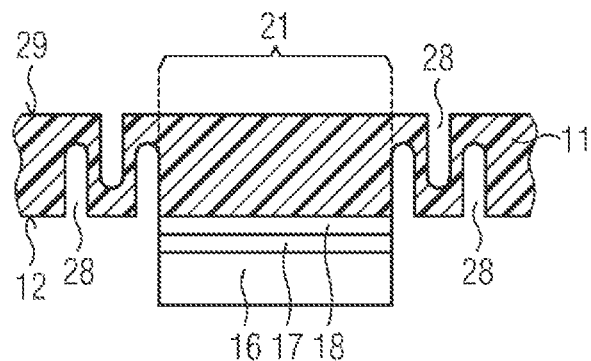

It is apparent in FIG. 4 that the contact region 21 is bordered at the edge by grooves 28 that are provided on alternating sides in the first mounting face 12 of the circuit carrier 11 and in the opposite face 29 that lies opposite said mounting face 12. This produces a structure that is comparable with a folding bellows or the edge structure of a loud speaker and its flexural rigidity is extremely low. For this reason, the contact region 21 is able to move easily in a perpendicular direction with respect to the joining direction.

Figure 5:
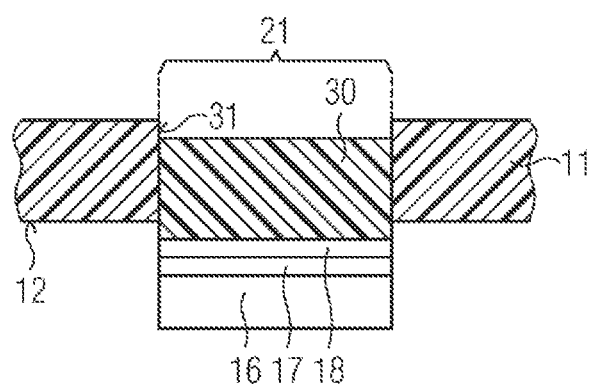

In FIG. 5, a fitting piece 30 is inserted as a contact region 21 into a cut-out 31, wherein the flexibility of the contact region 21 is provided by the fitting piece 30 moving in a perpendicular direction with respect to the orientation of the first mounting face 12 in the cut-out 31. In so doing, it is necessary to overcome the resistance that is produced as a result of friction in the case of an interference fit or transition fit as a result of the fitting piece being overdimensioned.

Figure 6:
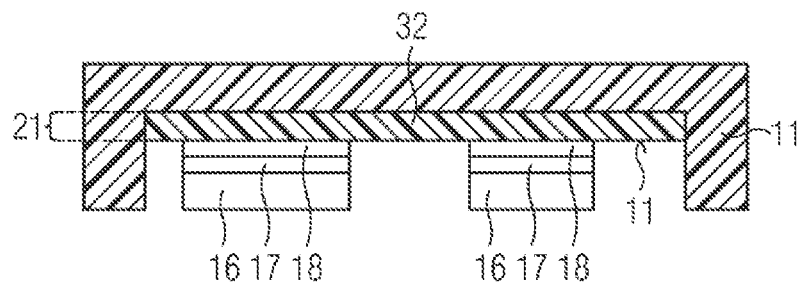

Finally, in FIG. 6, the contact region 21 is formed by means of an elastic layer 32 that is configured from a polysiloxane sheet that is placed in the depression on the circuit carrier 11 and is fastened thereto (by way of example by means of adhesive—not illustrated in detail) and the first mounting face 11 is formed. The layer is more elastic than the remaining part of the circuit carrier 11 that is formed by way of example by means of a conductor plate material.

Figure 7:
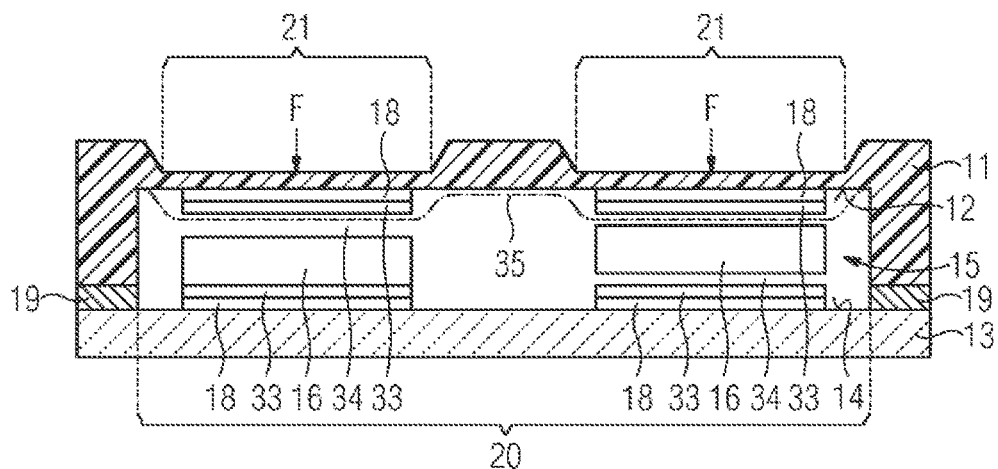

FIG. 7 illustrates the mounting process for the electronic assembly. It is clear that a joining gap 34 remains in the pre-mounted state of the assembly either intentionally on account of the intended production process or on account of the dimensional tolerances of the joining partners—in particular of the two circuit carriers 11, 13, of the components 16 and sintered components 33: depending upon which of the circuit carriers 11, 13 the component 16 is pre-mounted on, the joining gap arises lying opposite the associated sintered component 33 (however other configurations are also conceivable).

It order to bridge this joining gap, it is possible in this case for a joining force F to act on the first circuit carrier 11 during the sintering process with the result that the elastic contact regions 21 deform according to the bending line 35 that is illustrated by the dash-dot line, as a result of which the joining gap 34 becomes closed. Simultaneously, sufficient pressure is built up by means of the joining force F so as to form the sintered connections by means of the sintered component 33 (it goes without saying that the corresponding joining temperature must also be maintained).

Figure 8:
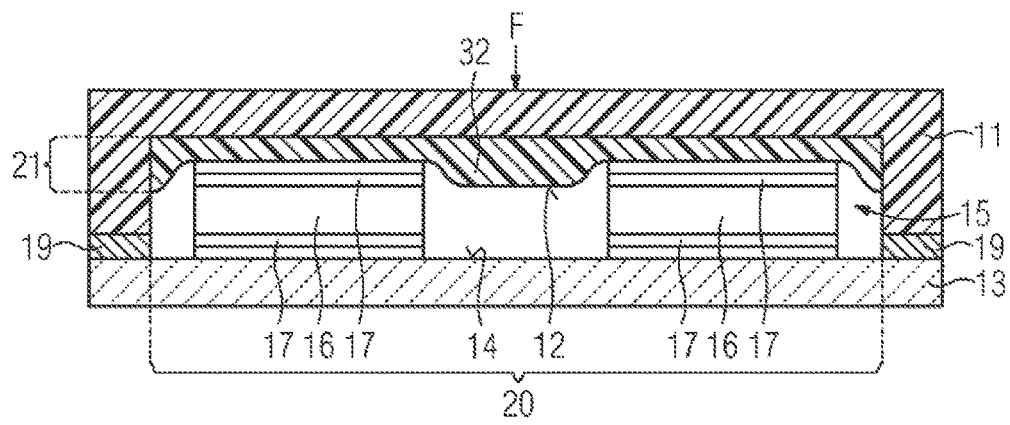

It is apparent in FIG. 8 the extent to which the elastic mounting face 12 is able to deform in the case of an overdimension of the components 16 (or also of sintered components that may be arranged in lieu of the illustrated soldered connections, cf. FIG. 7) if a joining force F is exerted on the bond between the components. In the case of a subsequent soldering procedure, the joining force F is transmitted via the elastic deformation of the layer 32 at least in part to the soldered connections that are formed with the result that said soldered connections may be formed in a reliable manner.

What is claimed is:
1. An electronic assembly comprising:
a first circuit carrier having a first mounting face for electronic components;
a second circuit carrier having a second mounting face for electronic components;
wherein the second mounting face faces the first mounting face and is connected thereto; and
an electronic component connected both to the first mounting face and the second mounting face;
wherein the first mounting face includes a contact region between the first circuit carrier and the component;
wherein the contact region is flexible in a direction perpendicular to the first mounting face in comparison to an adjacent region of the first circuit carrier surrounding the contact region and in comparison to the second circuit carrier; and wherein the contact region comprises a plurality of parallel cut-out grooves formed in an alternating manner in the first mounting face of the first circuit carrier and in an opposite face of the first circuit carrier facing away from the first mounting face.

2. The assembly as claimed in claim 1, wherein the contact region comprises a layer having material more elastic than the first circuit carrier apart from the contact region.

3. The assembly as claimed in claim 2, wherein the elastic layer comprises polysiloxane.

4. The assembly as claimed in claim 1, wherein the contact region of the first circuit carrier is thinner in comparison to the adjacent region of the circuit carrier.

5. The assembly as claimed in claim 4, wherein the thinner region comprises material laminated into the first circuit carrier and exposed in the contact region.

6. The assembly as claimed in claim 5, wherein the material of the thinner region comprises polyimide.

7. The assembly as claimed in claim 1, wherein the plurality of parallel cut-out grooves are located proximate an edge of the contact region.

8. The assembly as claimed in claim 1, wherein the first circuit carrier comprises a depression in the first mounting face and/or the second circuit carrier comprises a depression in the second mounting face; and the component is positioned in said depression.

9. The assembly as claimed in claim 1, wherein the first circuit carrier and the second circuit carrier form a cavity closed with respect to the external environment.

10. The assembly as claimed in claim 1, wherein the component is connected to at least one of the first mounting face or the second mounting face in a firmly bonded manner.

11. The assembly as claimed in claim 10, wherein the component is connected to at least one of the first mounting face or the second mounting face in a force-fitting manner.

12. A method for joining an electronic assembly, the method comprising:

fitting an electronic component to a first mounting face of a first circuit carrier;

joining the first circuit carrier to a second mounting face of a second circuit carrier; and forming connections between the electronic component and at least one of the first circuit carrier or the second circuit carrier;

wherein the first mounting face includes a contact region between the first circuit carrier and the component; and wherein the contact region is flexible in a direction perpendicular to the first mounting face in comparison to an adjacent region of the first circuit carrier surrounding the contact region and in comparison to the second circuit carrier; and wherein the contact region comprises a plurality of parallel cut-out grooves formed in an alternating manner in the first mounting face of the first circuit carrier and in an opposite face of the first circuit carrier facing away from the first mounting face.

13. The method as claimed in claim 12, wherein the connections formed between the first circuit carrier, the second circuit carrier, and the component include at least one of: sintering, soldering, or electrically conductive adhesive.

14. The method as claimed in claim 12, further comprising applying a joining force to the flexible contact region while the first circuit carrier is connected to the second circuit carrier.

* * * * *